(12) United States Patent
Lesso

(10) Patent No.: US 9,019,012 B2
(45) Date of Patent: Apr. 28, 2015

(54) AMPLIFIER CIRCUIT WITH OFFSET CONTROL

(71) Applicant: Wolfson Microelectronics plc, Edinburgh (GB)

(72) Inventor: John Paul Lesso, Edinburgh (GB)

(73) Assignee: Cirrus Logic International (UK) Limited, Edinburgh (GB)

( * ) Notice: Subject to any disclaimer, the term of this patent is extended or adjusted under 35 U.S.C. 154(b) by 0 days.

(21) Appl. No.: 13/677,182

(22) Filed: Nov. 14, 2012

(65) Prior Publication Data

US 2013/0127531 A1 May 23, 2013

Related U.S. Application Data

(60) Provisional application No. 61/561,605, filed on Nov. 18, 2011.

(51) Int. Cl.
*H03F 3/217* (2006.01)

(52) U.S. Cl.
CPC .................................... *H03F 3/217* (2013.01)

(58) Field of Classification Search
USPC ........................ 330/251, 10, 207 A
See application file for complete search history.

(56) References Cited

U.S. PATENT DOCUMENTS

| 7,058,464 | B2* | 6/2006 | Mallinson ................ 700/94 |
| 7,312,654 | B2* | 12/2007 | Roeckner et al. .......... 330/10 |
| 2011/0080217 | A1 | 4/2011 | Lee et al. | |

FOREIGN PATENT DOCUMENTS

| EP | 2 323 254 A1 | 5/2011 |
| EP | 2 375 566 A1 | 10/2011 |
| GB | 2459865 A | 11/2009 |
| JP | 2004-208216 A | 7/2004 |
| WO | WO 2011/064787 A1 | 6/2011 |

* cited by examiner

*Primary Examiner* — Hieu Nguyen
(74) *Attorney, Agent, or Firm* — Dickstein Shapiro LLP

(57) ABSTRACT

Methods and apparatus for Class-D amplifier circuits with D.C. offset control/correction. A Class-D amplifier is described having an output stage, such as a full H-bridge or half bridge, with a plurality of switches operable to provide a plurality of output states comprising at least a positive output state and a negative output state. Control circuitry is configured to receive a first signal based on the input signal and produce a digital control signal, which is used to determine the switch state of the output stage. A digital integrator is configured to receive a feedback signal indicative of the output state of the output stage and to sample the feedback signal at a sample rate and produce an integrated output signal (INT, IVC) indicating the difference in number of instances of the positive output state and the negative output state. Correction circuitry subtracts the integrated output signal from the input signal to produce a D.C. offset corrected signal.

43 Claims, 4 Drawing Sheets

AMPLIFIER CIRCUIT WITH OFFSET CONTROL

This application claims the benefit of Provisional Application No. 61/561,605, filed on Nov. 18, 2011, the disclosure of which is incorporated by reference.

BACKGROUND OF THE INVENTION

1. Field of the Invention

This invention relates to Class-D amplifier circuits with offset compensation or correction, especially to Pulse-Density-Modulated, Sigma-Delta or Pulse Width Modulated Class-D amplifiers with a full H-bridge or half-bridge output stage.

2. Description of the Related Art

FIG. 1 shows a basic arrangement of one example of a pulse-density-modulated (PDM) Class-D amplifier, sometimes referred to as a Sigma-Delta amplifier. An output stage 101 comprises four switches connected in a full H-bridge arrangement between two supplies, typically a supply voltage Vdd and ground (GND). Feedback signals from the output terminals 102 and 103 of the H-bridge 101 are respectively subtracted from the input signals Vin+ and Vin− of the amplifier in order to generate an error signal which is passed through a loop filter 104, for example an integrator.

The output signal from the loop filter 104 is quantized by a comparator 105 that is clocked to provide a digital control signal at a desired drive frequency $F_{DD}$. The desired drive frequency $F_{DD}$ is significantly higher than the frequency of the input signals to be amplified, Vin+ and Vin−, and, for an audio amplifier, the desired drive frequency $F_{DD}$ may have a frequency of the order of MHz, for example 3 MHz.

The digital control signal from the comparator 105 may be passed through optional logic 106 before being received by the pre-driver logic 107 to generate buffered gate drive signals for controlling the switches in the H-bridge output stage 101.

In a basic Class-D amplifier such as illustrated in FIG. 1 the H-bridge output may be operable in two states only, those illustrated as states A and B in FIG. 2: it should be noted that in use a load is connected between the output terminals 102 and 103 of the H-bridge 101. In continuous state A, assuming the upper rail is at Vdd and the lower rail is at ground, the output voltage across the load, i.e. terminals 102, 103, will settle to +Vdd (ignoring any switch voltage drops). In continuous state B, the voltage across the load will settle to −Vdd. Switching between states A and B with an effective duty of cycle of 50:50 will result in an output that averages to zero volts, and other duty cycles will result in intermediate differential average output voltages. Thus the switch drive signals from the pre-driver logic 107 control the H-bridge output to switch between states A and B as required and the output is averaged by an inductance (possibly an inductance associated with the load) to give low (e.g. audio) frequency components which follow the input signal.

Class-D amplifiers in which the H-bridge output 101 is operable in three states are also known. In such an amplifier the H-bridge output 101 may be operated in a third state, state C as illustrated in FIG. 2, in which both output terminals 102, 103 are connected, i.e. switched, to ground. The comparator 105 of FIG. 1 may therefore be modified to generate three output logic states, which may be regarded as +1, 0, −1 say, by comparing the integrated error signal at the output of the loop filter 104 against two separate thresholds, for example +Vdd/3 and −Vdd/3. The logic states +1, 0, −1 drive the H-bridge stage 101 in states A, C, B respectively. The use of state C, which has a differential output of zero, can reduce the number of transitions between states at low signal levels, thus saving on power and reducing ripple on the output which could otherwise lead to unwanted EMI.

In some amplifiers the H-bridge stage 101 may additionally be operated in a fourth state, state D in FIG. 2. In this fourth state both output terminals 102, 103 are connected, i.e. switched, to Vdd. This state D, like state C, thus has a differential output of zero. Logic circuitry 106 is typically arranged to ensure that, in those cycles where a zero differential voltage is desired, i.e. the output of the logic circuitry 106 is a logic 0, each of states C and D is chosen on average for half of those cycles. The inclusion of state D can avoid any signal dependent modulation of the common-mode output voltage and any associated distortion thus saving on power and reducing ripple on the output which could otherwise lead to unwanted EMI.

The embodiment shown in FIG. 1 is an example of a Pulse-density-modulated (PDM) Class-D amplifier. Pulse-width-modulation (PWM) control is also known where the output stage is switched between states A and B, and possibly states C and optionally D, by pulses of varying widths possibly based on comparing the input signal (or an error signal derived therefrom) to a time-varying cyclic reference signal. Examples of time-varying cyclic reference signals comprise, for example, a zigzag type wave such as a triangle wave or sawtooth wave, a square wave or a sinusoidal wave.

DC offset can be a problem in Class-D amplifiers such as described above, especially when used for audio applications. For the H-bridge output stage described above, the peak differential voltage across the load will either be +Vdd or −Vdd, so it is natural for the quiescent output voltage across the load to be set to zero, and as a result this requires no AC coupling/DC blocking capacitor. Similarly for the case of a half-bridge output stage driving a grounded load from symmetrical bipolar supplies say +Vdd and −Vdd, the notional quiescent output voltage is ground and likewise no AC coupling/DC blocking capacitor would be required for the output signal. The presence of a DC offset voltage at the output of the audio amplifier can lead to an offset voltage being suddenly imposed on the speaker load at power-up, or conversely suddenly removed at power-down, which may lead to an audio artefact such as an audible 'pop'. Such an audio artefact is undesirable and should be reduced, or preferably avoided, if possible. Further, in the absence of any DC blocking capacitor the presence of a DC offset voltage at the output of an amplifier can lead to power wastage due to the resultant quiescent load current. Such wastage is an issue for battery powered devices such as mobile phones for example where unnecessary power consumption reduces battery life.

Embodiments of the present invention therefore provide methods and apparatus for Class-D type amplification that at least mitigate some of the above mentioned disadvantages.

SUMMARY OF THE INVENTION

Thus according to the present invention there is provided a Class-D amplifier circuit for amplifying an input signal comprising: an output stage comprising a plurality of switches operable to provide a plurality of output states comprising at least a positive output state and a negative output state; control circuitry configured to receive a first signal based on the input signal and produce a digital control signal, wherein the digital control signal is used to determine the switch state of the output stage; a digital integrator configured to receive a feedback signal indicative of the output state of the output stage, to sample said feedback signal at a sample rate, and to produce an integrated output signal indicating the difference in number of instances of the positive output state and the negative output state; and correction circuitry for subtracting the integrated output signal from the input signal to produce a signal from which the first signal is derived.

The feedback signal may be derived from the signal path of the amplifier upstream of the output stage and may be derived from the digital control signal produced by the control circuitry. The feedback signal may comprise the digital control signal produced by the control circuitry or a modulated version of the digital control signal. The feedback signal may alternatively be separately derived from said control circuitry.

The amplifier may comprise at least one pre-driver configured to generate switch control signals for said plurality of switches and the feedback signal may be derived from such switch control signals. The feedback signal may also derived from the output stage or from the output from the output stage. A comparator may be arranged to receive the output of the output stage, the comparator being clocked to generate the feedback signal.

The digital integrator may be operable in a first mode wherein the gain of the digital integrator has a first value such that the bandwidth of the feedback loop comprising the integrator is lower than the frequency band of the signals of interest. The digital integrator may have a variable gain. The digital integrator may also be operable in a second mode wherein the gain of the integrator has a second value, which is higher than the first value. The digital integrator may be configured to operate in the second mode in response to a trigger and may operate in the second mode for a predetermined period of time and/or until the integrated output signal is stable. The trigger may comprise at least one of: power-on of the amplifier, a start command or a reset command. When the feedback signal is not derived from the output stage the output stage may be disabled during the second mode of operation.

The amplifier may be configured such that if the amplifier operation is halted the then current value of the integrated output signal is maintained and used as an initial value of integrated output value when the amplifier is re-enabled.

The integrated output signal may be digitally subtracted from a digital input signal or the correction circuitry may comprise a digital to analogue converter for converting the integrated output signal into an analogue offset correction signal and subtracting the analogue offset correction signal from an analogue version of input signal. The correction circuitry may comprise a loop filter circuit configured to receive the analogue input signal and analogue offset correction signal.

The amplifier may be a pulse-density-modulated amplifier. The control circuitry may configured so as to produce the digital control signal at a first clock rate wherein the sample rate of the feedback signal is substantially equal to said first clock rate.

The amplifier may be a pulse-width-modulated amplifier. The control circuitry may be configured so as to receive a cyclic reference signal at a first clock rate and to within each cycle of said first clock rate adjust the amount of time at which the digital control signal spends at each possible output value. The control circuitry may be configures such that, within each cycle of said first clock rate, the digital control signal is at one value for one continuous period and at another value for the remainder of the cycle. The control circuitry may compare the first signal to said cyclic reference signal. The sample rate at which the digital integrator samples the feedback signal may be greater than the first clock rate and may be at least 64 times greater. There may be dither circuitry for applying temporal dither to the sample rate at which the digital integrator samples the feedback signal. The digital integrator may comprise counter circuitry for receiving the feedback signal and a clock signal at a second clock rate and producing a count value indicating the difference in number of instances of the positive output state and the negative output state during each period of the second clock. The second clock rate may be equal to the first clock rate. The counter circuitry count value may be reset at the second clock rate. The counter circuitry count value may be input at the second clock rate to a digital integrating adder stage which outputs the integrated output signal at a third clock rate. The second clock rate may be equal to the third clock rate.

The output stage may comprise a full H-bridge stage or a single-ended half bridge stage. The control circuitry may comprise a quantizer.

The amplifier may be implemented as an integrated circuit and/or may provide a driver circuit, such as a driver circuit arranged to drive at least one of: an audio transducer, a haptic transducer, an ultrasound transducer; or an electromechanical actuator or motor.

The amplifier may be implemented in an electronic device which may be at least one of: a portable device; a battery powered device; a mobile communications device; a computing device; a gaming device; an audio device; or an ultrasonic device.

The invention also relates to a method of correcting for D.C. offset in a Class-D amplifier. Thus in another aspect of the invention there is provided a method of correcting for D.C. offset in a Class-D amplifier having an output stage operable to provide a plurality of output states comprising at least a positive output state and a negative output state, the method comprising: receiving a first signal based on an input signal to be amplified and producing a digital control signal used to determine the output state of the output stage; receiving a feedback signal indicative of the output state of the output stage; sampling said feedback signal at a sample rate; producing an integrated output signal indicating the difference in number of instances of the positive output state and the negative output state; and subtracting the integrated output signal from the input signal to produce a signal from which the first signal is derived.

The method of this aspect of the invention may be implemented in any of the embodiments as described above in relation to the first aspect of the invention.

In another aspect of the invention there is provided a Class-D amplifier circuit for amplifying an input signal comprising: an output stage comprising a plurality of switches operable to provide a plurality of output states comprising at least a positive output state and a negative output state; first circuitry for sampling a signal indicative of the output state of the output stage to produce an offset value indicative of the difference in the number of instances of the positive output state compared to the negative output state over time; and correction circuitry configured to apply offset correction to said input signal based on said offset value.

In a further aspect there is provided a Class-D amplifier circuit for amplifying an input signal comprising: an output stage comprising a plurality of switches operable to provide a plurality of output states comprising at least a positive output state and a negative output state; first circuitry for determining, over time, an offset value indicative of any difference in the amount of time the output stage spends in the positive output stage compared to the negative output stage; and correction circuitry configured to apply offset correction to said input signal based on said offset value.

In a further aspect there is provided a Class-D amplifier circuit for amplifying an input signal comprising: an output stage operable in at least a positive output state and a negative output state; feedback path for D.C. offset correction, wherein said feedback path comprises a digital integrator configured to receive a digital signal indicative of the output state of the amplifier and to produce a value indicative of the difference in the number of samples indicating the positive output state and the number of samples indicating the negative output state.

BRIEF DESCRIPTION OF THE DRAWINGS

The invention will be now be described by way of example only with respect to the following drawings, of which.

DETAILED DESCRIPTION OF THE PREFERRED EMBODIMENTS

Figure 3:
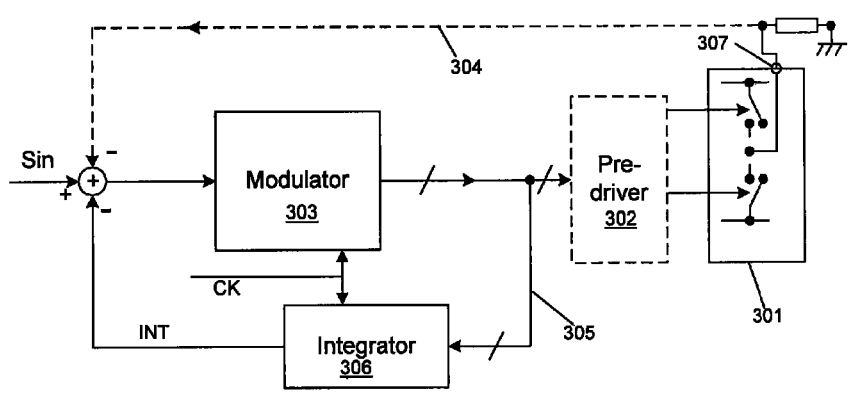
FIG. 3 illustrates the principles of an amplifier arrangement according to an embodiment of the invention.

FIG. 3 illustrates the principles of a pulse-density-modulated Class-D amplifier according to an embodiment of the invention. It will be understood however that the principles may be applicable to any type of Class-D amplifier, which are sometimes referred to as sigma-delta amplifiers or switched amplifiers or PWM amplifiers.

The amplifier arrangement shown in FIG. 3 has an output stage 301 which, in this example, is a half-bridge or single-ended output stage wherein the load is connected to ground. The output stage 301 comprises two switches which connect the single output node to a first voltage or a second voltage. The output stage 301 thus has two switch states, a first state wherein the output node 307 is connected to the first voltage and a second state wherein the output node 307 is connected to the second voltage. Typically the first voltage may be +Vdd and the second voltage may be −Vdd and thus the output stage 301 is operable in a positive state to output +Vdd or a negative state to output −Vdd. The output stage 301 may be driven by pre-driver circuitry 302, although in some embodiments the pre-driver may be included in the modulator 303 or may not be required.

Figure 1:
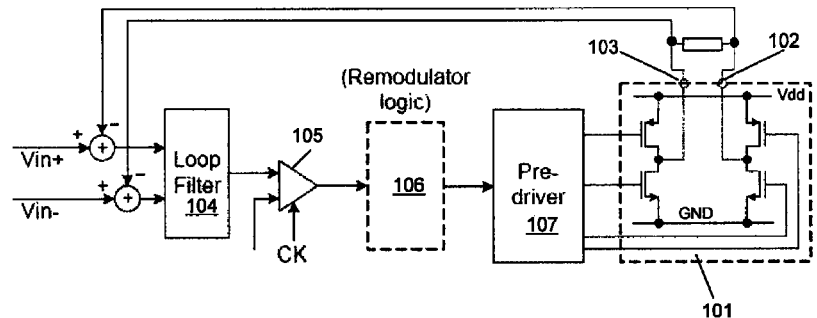
FIG. 1 illustrates a basic Class-D amplifier.

The amplifier comprises modulator or control circuitry 303 for receiving the input signal Sin and producing a digital control signal, possibly a multi-bit digital signal, indicative of which output state the output stage 301 should be switched into. The modulator 303 may therefore comprise a comparator as described above in relation to FIG. 1, or more generally any two level quantizer, to produce a series of quantised output signal samples, i.e. a quantised sample each period $T_{DD}=1/f_{DD}$ of an applied clock signal, CK. Thus the output of the modulator 303 may be, for example, a logic +1 or −1 depending on the level of the input signal Sin. It will be noted that FIG. 3 shows that there may also be an optional feedback path 304 direct from the output terminal 307 wherein the output signal is subtracted from the input signal in a manner as discussed above with relation to FIG. 1.

The amplifier also comprises a separate feedback path 305 which comprises a integrator 306 which may be in the form of a digital integrator. The integrator 306 is arranged to receive a feedback signal sample each period $T_{DD}$ of the applied clock CK indicating whether the modulator 303 has output a control signal indicating a positive output state or a negative output state for the output stage and to produce an integrated signal, INT, indicating the difference in the number of instances of the positive output state and the negative output state. In the embodiment illustrated in FIG. 3 the integrator 306 is arranged to receive and integrate the +1 or −1 quantized output signals from the modulator 303. Each occurrence of the positive output state will thus increase the output value of the integrator 306 and each occurrence of the negative output state will thus decrease the integrator's output value.

The integrated output value thus inherently provides an indication of the difference in the number of instances of the positive output state and negative output state over time, or, in other words an indication of the difference between the amount of time that the output stage spends in the positive output state as compared to the amount of time spent in the negative output state. As will be appreciated, with PDM control the output stage is switched between states synchronously with the clock signal CK.

For an A.C. signal with no D.C. offset, i.e. no zero frequency component, one would expect, over time, that the number of instances of the positive output state would equal the number of instances of the negative output state, i.e. the output stage spends as much time in the positive state as in the negative state. Any D.C. offset however will lead to a greater occurrence of the positive output state compared to the negative output state or vice versa. The output of the integrator 306 therefore provides an inherent indication of any D.C. offset at the output of the amplifier.

The integrated output signal INT is therefore subtracted from the input signal Sin to cancel any D.C. offset. Over time, this ensures that the long term averages of time spent in the positive and negative output states are equal.

Figure 4:
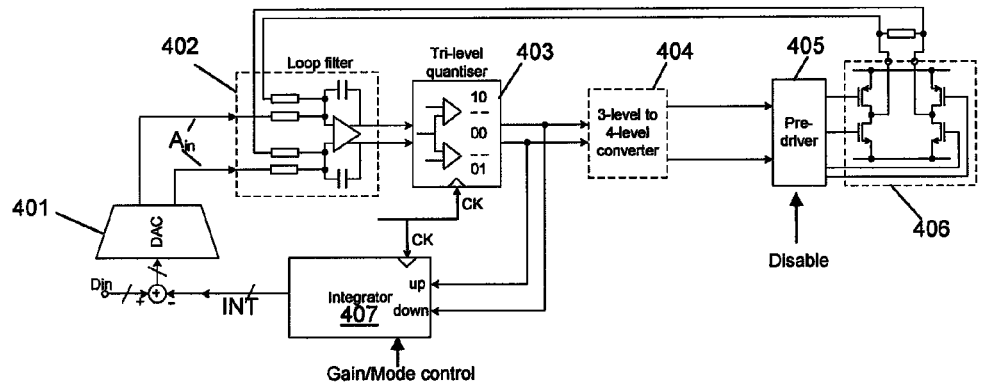
FIG. 4 illustrates an amplifier circuit according to one embodiment of the present invention.

FIG. 4 illustrates an embodiment of an amplifier circuit according to the present invention in more detail. The amplifier of FIG. 4 receives a digital input signal Din which is converted by Digital-to-Analogue converter (DAC) 401 into an analogue version Ain of the digital input signal Din. The differential analogue input signal Ain is input to a loop filter 402 which receives feedback signals from the output terminals of the output stage 406 and generates filtered error signals as described previously in relation to FIG. 1. The filtered error signals pass to a quantizer 403 which in this example is a tri-level quantizer that is clocked by a clock signal CK, which is at a relatively high drive frequency $f_{DD}$, in order to provide a pulse density modulated (PDM) three level drive signal. In this example the output of the tri-level quantizer 403 may be a two wire drive signal and the output may be represented as signal states 10, 00 and 01.

Figure 2:
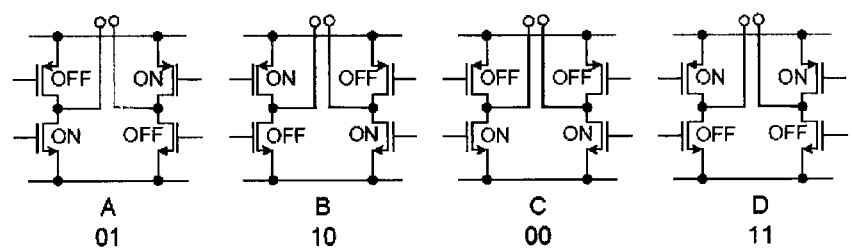
FIG. 2 illustrates four possible output states of an H-bridge output stage.

For amplifiers where the output H-bridge is driven in three states, these states may be mapped one-to-one directly to the three output states A, B and C illustrated in FIG. 2. For four-state output schemes, the output from tri-level quantizer 403 may be input to logic circuitry such as a converter or remodulator 404 to generate four output states from a 3 state input signal. The convertor 404 may clocked by the clock signal CK and may output any of four logic output states, 10, 00, 01 and 11. Inputs 10 and 01 are mapped to the output states 10 and 01. However input logic state 00 may be mapped to be output logic state 11 for, at least some, e.g. half, of the relevant cycles or clock periods and mapped to output state 00 for the rest of the relevant cycles to maintain a desired common-mode output voltage as discussed above.

The output of converter 404 may be passed to a pre-driver 405 which controls the output stage 406 as described previously.

It will of course be appreciated that the function of the quantizer 403 and converter 404 (if present) could be combined. Additionally or alternatively the function of the converter 404 and pre-driver 405 (if present) may be combined and the converter may directly produce drive signals for the H-bridge 406. In some embodiments the quantizer 403 may be only a two level quantizer and the converter may be a two-to-three or two-to-four level converter acting to replace the 01 or 10 states with zero level states when appropriate, for instance by determining sequences where the states alternate in quick succession.

In this embodiment the two-wire quantized output signal from the quantizer 403 is also used as a feedback signal to an integrator 407 which may, for example, be an up/down integrating counter. The integrator is clocked at the same clock frequency $f_{DD}$ as the quantizer 403 in order to process each sample that is output on the two outputs from the quantizer 403. For each clock cycle a logic 1 at one of the two inputs to the integrator 407 will increment the count by +G and a logic 1 at the other input will decrement the count by −G, where G is the gain of the integrator 407.

Thus a signal indicating the positive output state, i.e. 10, will result in the integrated value incrementing whereas a signal indicating the negative output state 01 will result in the integrated output decrementing. If a signal representing the zero state, 00, is received the integrated output value is left unchanged. Note that in the embodiment shown in FIG. 3 the output state 11 is not generated by quantizer 403 (although, as will be discussed later, state 11 could be converted to state 00 in the feedback path prior to the digital integrator by appropriate logic if required or the integrator 407 may be able to interpret logic 1 at both inputs as no change in value).

It will therefore be clear that, as described previously, the value of the integrated output signal INT from the digital integrator 407 will reflect the difference in the number of instances of the positive and negative output states, the occurrence of any zero states effectively being ignored.

As mentioned above the integrator 407 increments by an amount, G, for each instance of a positive output state and decrements by the same amount for each instance of a negative output state. Thus (assuming an ideal output stage 406) if the average output voltage is Voff, due to perhaps an offset voltage of the amplifier in the modulator for example, then the integrator output will be a scaled integrated digital version of this offset, ramping up at a rate $(Voff/Vdd)*G/T_{DD}$ where $T_{DD}$ is the clock period. The integrator output will thus be positive for a positive DC offset and negative for a negative DC offset. The integrated output can therefore be subtracted from the input signal Din to correct for any DC offset. It will of course be appreciated that the digital integrator could equally be arranged to decrement the output value in response to a positive output state and increment in response to a negative state, in which case the output value may be added to the input signal. It will be clear that adding an integrated output signal where the polarity of the integrated output signal is opposite to the polarity of any DC offset present is the same as subtracting an integrated output signal where the polarity of the input signal is the same as DC offset.

The digital integrator 407 is arranged so that the integrated output value is relatively stable over short time periods, i.e. on the time scale of variation of the actual input signal, but varies with any long term variation in D.C. offset, such as variations due to thermal variations or the like. The bandwidth of the feedback loop comprising the digital integrator 407 may therefore be substantially lower than the frequency band of the signals of interest. The feedback loop comprising the digital integrator 407 may have a unity gain loop bandwidth of the order of 0.1 Hz or so.

The gain, G, of the integrator is therefore set such that at normal frequencies in the application in which the amplifier operates, for example audio frequencies for an audio signal application, the normal feedback loop (i.e. the loop including the feedback path from the output stage 406 to loop filter 402) dominates. This will normally have a flat frequency response, at least within the signal band. At low frequencies the digital integrator 407 will have high gain and will thus dominate so as to attenuate any D.C. offset and indeed any very low frequency signals. Thus, normal frequencies, for example in-band audio signals, will be unaffected, but any slow drift in D.C. offset will be compensated for.

As previously mentioned the low bandwidth of the loop comprising the digital integrator 407 ensures that the offset correction has no substantial effect on signals of interest in operation. However this does mean that on initial start-up or reset it may take some time for the integrated output value from the digital integrator 407 to reach a stable level sufficient to compensate for any D.C. offset. If the time taken to compensate for any D.C. offset is too long then on start-up of the amplifier any D.C. offset may be imposed on the load and, in an audio application, pops or clicks may still occur. Thus in one embodiment the gain, or a mode of operation, of the digital integrator 407 may be variable. For example the digital integrator gain may be varied, i.e. controlled, by a gain control signal, and the gain may be increased when required to reduce the time take to reach a stable integrator output signal.

In response to a suitable trigger, for instance a start-up trigger or a reset of the amplifier circuit trigger, maybe detected by suitable trigger detection circuitry in order to generate the gain control signal, the gain of the integrator may be set at a relatively high value, to increase the loop bandwidth, for example to around 1 kHz or so. Any D.C. offset is thus rapidly compensated for, giving a reduced power-on click.

The digital integrator 407 may therefore be operable in at least two modes, a first mode for normal operation of the amplifier where the gain of the amplifier is set at a low value so that the loop bandwidth is lower than the signal band of interest, and a second mode for start-up where the gain of the digital integrator is increased for rapid compensation. In the second mode the input signal may be muted, i.e. set to zero, in order to avoid any attempt of tracking of an input signal that would otherwise be present.

In some embodiments, the output stage 406 may be disabled when operating in the second mode, for instance the output stage 406 could be tri-stated by a logic signal (Disable) applied to the pre-driver or possibly to the output stage itself. Thus no signal is applied to the load until substantially the 50:50 ratio of states 01 and 10 is established, i.e. any D.C offset is substantially reduced or removed so, in the case of an audio application, no audible artifact, i.e. click or pop, is heard.

In other embodiments, the output stage 406 may still be activated during the second mode. There may be a minor click on initial start-up as the output stage 406 steps up to the DC offset of, say, a few millivolts for a few milliseconds until the loops settles out, but offsets due to effects such as feedback resistor mismatch or output stage switch mismatch will now be compensated for. (Offsets due to feedback resistor mismatch may be significant in cases where the H-bridge output common-mode voltage is different from the DAC output common-mode voltage and thus D.C. current flows in these resistors).

On start-up or reset the amplifier may be operated with the digital integrator 407 operating in the second, high bandwidth, mode, before switching to the first, low bandwidth, mode for normal operation. The transition from the start-up mode to the normal mode may occur after a certain period of time. In other words the amplifier may start in the second, or start-up mode, possibly with the output stage 406 disabled. After a predetermined time when the system may be anticipated to have settled out the output stage 406 may be enabled (if it had been disabled) and a further small time allowed for any resulting small transient to settle out, before the digital integrator 407 is switched to the first or normal mode with the gain being reduced so that the bandwidth is set back to its normal small value. Note the stable integrator output signal is maintained at the bandwidth transition, so there should be no transient due to the bandwidth change.

Alternatively the amplifier may be arranged to operate in the second mode until a stable integrated output value is reached. Thus the amplifier may detect the stability of the average integrator output and, when stability is reached, switch to the first mode of operation as described above. For instance circuitry may be provided that checks whether the output of the integrator has changed by more than M LSBs in every N clock cycles where M and N are suitable numbers chosen during design or in operation based on system dynamics or operational conditions.

In some embodiments the amplifier circuit may be arranged such that the amplifier may be temporarily shutdown either in whole or in part and the appropriate circuitry is de-activated. The amplifier may therefore be arranged such that when the amplifier operation is halted the value of the integrated output signal is maintained and used as an initial value of integrated output value when the amplifier is re-enabled. In other words the established output of the integrator is maintained or stored, e.g. by just interrupting its clock, or combinatorially gating its inputs to effectively be 00. Then on re-enabling, the stored integrator value may be re-used. This should thus immediately re-establish zero offset, save for any typically smaller, extra variation due to say temperature drift.

The amplifier can therefore be controlled to provide continual D.C. offset compensation in normal operation to account for temperature drifts and the like and thus reduces wasteful power consumption due to a D.C. offset across the load. The amplifier can also be controlled to provide rapid offset correction on start-up, reset and/or shutdown so as to reduce pops or clicks (in an audio application) and also during transition between modes of operation so as to provide a smoother transition between modes.

Whilst FIG. 4 shows the output from the quantizer 403 being used directly as the input to the integrator 407 it will be appreciated that the feedback signal for the integrator could be derived from anywhere in the signal path upstream of the output stage.

Figure 5:
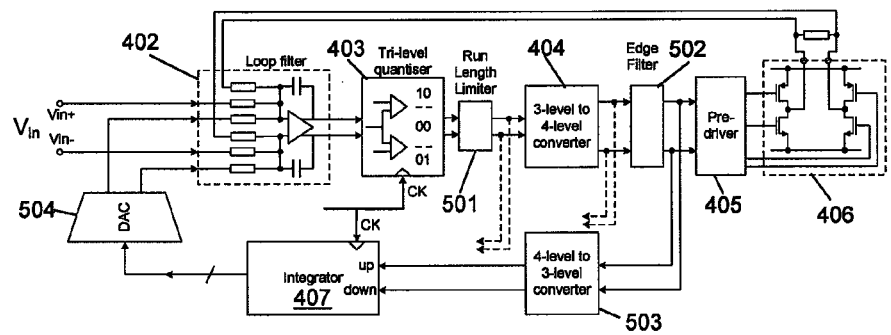
FIG. 5 illustrates an amplifier circuit according to another embodiment having an analogue input signal.

FIG. 5 shows an alternative embodiment of the invention. This embodiment has a loop filter 402, quantizer 403, converter 404, pre-driver 406 and H-bridge output stage 406 as described previously. However the amplifier signal path also includes a run length limiter 501, and an edge filter 502. In the embodiment shown in FIG. 5 the input signal Vin is an analogue differential input signal (Vin+, Vin−) which is input directly to the loop filter 402.

The run length limiter 501, which receives the output of the quantizer, acts to increase the number of zero states by periodically replacing instances of state 10 followed shortly by 01 (or vice versa) with two instances of state 00. This may increase high-frequency quantization noise slightly, but does not affect low-frequency signal components. The output from the run length limiter is then passed to the three-to-four level converter as described previously.

The edge filter 502 receives the output from the converter 404 and acts to reduce the number of state transitions to advantageously save power where possible. Thus the edge filter 502 receives the output from the converter 404 and, if possible, varies the order in which the instances of each state occur so as to reduce state transitions without altering the number of instances of each state. This may increase high-frequency quantization noise slightly, but does not affect low-frequency signal components As shown in FIG. 5 the feedback signal for the integrator 407 may therefore be taken from the output of the edge filter 502. As this is a four level signal, including possible instances of state 11, there may be a four-to-three level converter 503 which acts to replace instances of state 11 with state 00. The output of converter 503 is then passed to integrator 407 which operates as described previously. Alternatively the integrator 407 may be modified to include this functionality or otherwise to treat a 11 input sample similarly to a 00 input sample.

As the input signal Vin is an analogue signal, the integrated output signal from the digital integrator 407 is converted to an analogue offset correction signal by DAC 504. The analogue offset correction signal may then be subtracted from the analogue input signal. In the embodiment shown in FIG. 5 the input signal Vin is a differential input signal (Vin+, Vin−) and the offset correction signal is also a differential signal. The subtraction of the correction signal from the input signal is performed by providing an additional differential analogue input (derived from the DAC 504) to the resistor array of the loop filter 402. Thus loop filter 402 may comprise part of the correction circuitry of the amplifier, together with DAC 504 for subtracting the integrated output signal from the input signal Vin. It should be appreciated that alternative embodiments of the correction circuitry could exist. For example, a complete stage could be added to subtract the analogue offset correction signal from the input signal prior to the loop filter 402.

Whilst the embodiment described uses a feedback signals from the output of the edge filter 502 it will be apparent that the feedback signals could be derived from a number of other nodes along the signal path upstream of the output stage, for instance from the output of converter 404 or from the output of the run length limiter 501, in which case converter 503 would not be required. The feedback signals could also be derived from the output of the pre-driver 405. As stated above, the low frequency components of the effective digital signals are unaffected by the processing in the intervening blocks, so use of these signals is straightforward.

Figure 6:
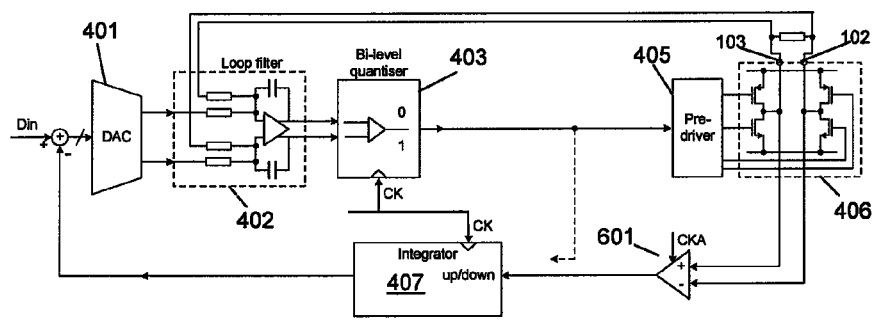
FIG. 6 illustrates an amplifier circuit according to a further embodiment.

It is also possible that the feedback signal is derived from the output stage. FIG. 6 shows a further embodiment of an amplifier comprising a DAC 401, loop filter 402, quantizer 403, pre-driver 405, H-bridge output stage 406 and digital integrator 407 as described previously. In this embodiment the quantizer may be a two-level quantizer.

As described previously the quantizer digital output could be used to control the integrator 407, to increment or decrement by G according to the polarity. However in this embodiment the feedback signal may be derived from the output terminals 102, 103 of the output stage 406. It will be appreciated however that the signals derived from the output terminals 102 and 103 will not be pure digital signals and the voltage levels at the output terminals 102 and 103 may exhibit output inductive transients and ringing etc. For the error feedback loop the presence of the loop filter means that such transients are not a significant concern. However in the offset compensation loop as described above the presence of transients may lead to errors in compensation.

In the embodiment shown in FIG. 6 therefore a clocked differential comparator 601 attached to the output nodes 102, 103 may be used as an indication of the polarity of the output signal. This comparator 601 may be clocked with a delayed clock CKA to allow for any delay though the output stage 406 and pre-driver 405, and also to allow for output inductive transients and ringing to die away. The use of a clocked differential comparator with a delayed clock represents a novel aspect which allows the feedback signal for offset correction (as described above) to be derived from the output of the output stage.

Figure 7:
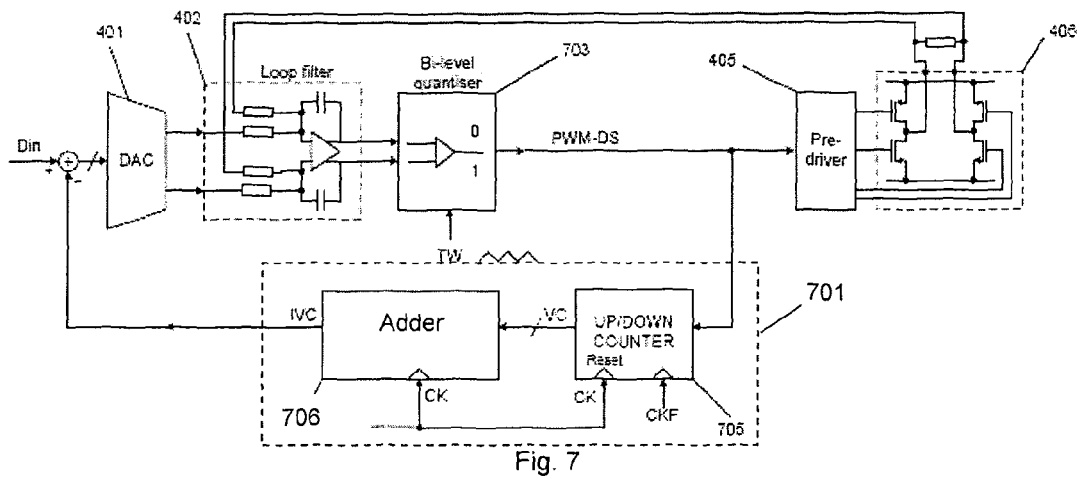
FIG. 7 illustrates another embodiment having PWM control.

FIG. 7 illustrates a further embodiment of an amplifier comprising a DAC 401, loop filter 402, pre-driver 405, H-bridge output stage 406 and digital integrator 701 as described previously.

This further embodiment also comprises a bi-level quantizer 703 which receives, in this particular embodiment, the filtered differential error signal that is output from the loop filter 402 and an input reference signal TW in the form of a triangle wave.

In this further embodiment the digital integrator 701 comprises an up/down counter 705 and an integrating adder 706, i.e. an integrator with adder functionality. It should be appreciated that the up/down counter may be a standalone stage, as illustrated, or may be formed as part of the integrating adder 706.

In this particular embodiment, the Class-D amplifier is controlled on a pulse-width-modulation (PWM) basis as opposed to a pulse-density-modulation (PDM) basis as per the embodiments illustrated in FIGS. 1-6.

The filtered error signal that is output from the loop filter 402 is compared within the bi-level quantizer 703 to the triangular wave input reference signal TW in order to provide a pulse-width-modulated (PWM) two-level drive signal PWM-DS. It will be appreciated of course that other embodiments may use other shapes of time-varying cyclic reference signal, for instance sawtooth, sinusoidal etc. It will also be appreciated that the time-varying reference signal could be applied to the filtered error signal and the combined signal compared to a fixed threshold in order to perform the comparison.

Other embodiments may generate the PWM-DS signal based on a clock signal, for instance via digital signal processing. In general, with a PWM control scheme, the control circuitry will generate a digital control signal with a variable duty cycle. In other words within each control cycle, e.g. the period defined by the cycle duration of the triangular waveform or clock period, the quantizer or control circuitry will adjust the amount of time in which the output digital control signal spends at each possible output value. Typically the control circuitry will be arranged to produce, during each control cycle, one continuous period of one output value with the rest of the control cycle being (for a bi-level arrangement) the other output value.

It will therefore be clear that the digital control signal output from the quantizer 703 may be asynchronous, i.e. any changes in value or not timed in relation to a clock edge.

In this example the output of the bi-level quantizer 703 is illustrated as a one-wire drive signal PWM-DS and this output drive signal PWM-DS is represented as signal states 1 or 0.

The pre-driver 405 receives the drive signal PWM-DS and controls the output stage 406 in the same manner as described previously, e.g. the drive signal being signal state 1 selects the positive output state say (State A in FIG. 2) and signal state 0 selects the negative output state (State B in FIG. 2).

In this FIG. 7 embodiment, the pulse width modulation drive signal PWM-DS from the quantizer 403 is also used as a feedback signal to the integrator 701 and is received by the up/down counter 705. The up/down counter effectively converts the PWM drive signal into a digital value, representative of the time spent in the positive output state compared to time spent in the negative output state. The output from the up/down counter 705 is passed to the integrating adder 706.

The up/down counter 705 in this PWM embodiment is clocked by clock signal CKF which is relatively fast compared to the clock signal used to derive the triangular waveform applied to the quantizer 703 and also to the clock signal applied to the integrating adder 706. Note that the same clock signal CK may be used to derive the triangular waveform (with the waveform rising for half the clock period and falling for half the clock period) as is used for the quantizer 703. The up/down counter 705 also receives the clock signal CK that is used to clock the integrating adder 706 which is input to a reset input terminal of the up/down counter. Therefore, the count value VC from the up/down counter is reset to zero every clock period of the clock CK.

Within a clock period of the system clock CK, when the drive signal PWM-DS has a logic 1 state for example, the up/down counter 705 counts up at a rate determined by the fast counter clock CKF. Conversely, when the drive signal (PWM-DS) has a logic 0 state for example, the up/down counter 705 counts down at a rate determined by its clock CKF. The net result is that a multi-bit count value VC is output from the up/down counter 705, at a frequency determined by the clock signal CK. This count value VC indicates the relative time that the output stage will spend in the positive output state compared to the negative state in a clock period, i.e. the duty cycle of the PWM drive signal.

The frequency of the fast clock signal CKF received by the up/down counter has to be sufficiently faster than the frequency of the integrating adder clock signal CK to be able to count the width, i.e. duration, of each of the states of the drive signal PWM-DS in each CK clock cycle with a sufficient degree of resolution for fine enough operative PWM control of the dc offset of the Class-D amplifier as will be readily understood by persons skilled in the art. Also the frequency of the triangle or other cyclic waveform applied to the quantizer, usually the same as the integrating adder clock signal, is preferably at least about an order of magnitude faster than the signal frequency for adequate reproduction of the input signal and stability of any signal-band feedback loop.

By way of a non-limiting example, if the frequency of the clock signal CK is say 375 KHz then in order to achieve a:
1% resolution of dc offset voltage, the frequency of the fast clock signal CKF should be 37.5 MHz;
0.5% resolution of dc offset voltage, the frequency of the fast clock signal CKF should be 75 MHz; or
0.1875% resolution of dc offset voltage, the frequency of the fast clock signal CKF should be 200 MHz etc. etc.

Therefore, the relationship between the frequency of the integrating adder clock signal CK and that of the fast clock signal CKF can be set relative to one another in order to provide the desired resolution.

To provide finer average resolution dither may be applied to the fast clock signal CKF. Dither of the fast clock signal CKF may be generated by any known technique. As will be appreciated applying random dither to the clock signal to vary the time at which a clock edge falls (compared to an undithered version of the signal) can help provide a better average resolution. Clearly the amount of dither between successive clock edges should be less than the clock period but over the course of many hundred clock cycles or more the total amount of dither may preferably be equal or greater than the clock period of the fast clock signal.

The multi-bit output count value VC from the up-down counter is provided as an input to the integrating adder 706 and could be considered as a sub-total output from the up-down counter that is output every period of the clock signal CK. Creating this sub-total output VC has an advantage in that the integrating adder does not need to be clocked at the rate of the fast clock signal CKF received by the up/down counter which is advantageous for power saving. As mentioned the integrating adder 706 which comprises an adder (not illustrated) is clocked, in this particular embodiment, at the same clock frequency $f_{DD}$, as the quantizer 703 in order to synchronously process each multi-bit number that is output from the up/down counter 705. It will be appreciated that the respective frequency at which the integrating adder 706 and quantizer 703 are clocked need not necessarily be the same. The integrating adder 706 may be clocked at a frequency that is a multiple of the frequency at which the quantizer 703 is clocked and vice versa.

Each multi-bit number VC, i.e. sub-total, output from the up/down counter 705 during a clock period (CKp) is added to, (or in some embodiments equivalently subtracted from) the previous integrated output number of the integrating adder 706 that existed during the previous clock signal (CKp−1). The integrated count value IVC output from the integrator 701 is then processed as previously herein described, maybe including the application of an integrator gain factor G.

In this embodiment, each clock cycle of the integrating adder clock CK, the up-down counter derives a count VC, i.e. sub-total, representing the difference between the number of instances of a positive output stage state and the number of instances of a negative output stage state, these instances being sampled at the high clock rate of CKF. These counts are then integrated or accumulated over time at a sample rate of the integrating adder clock CK. Thus the integrator 701 output, i.e. total count, represents the long-term running total of the difference between numbers of positive and negative output stage states (possibly scaled by an applied integrator gain factor).

In alternative embodiments, instead of a two stage integrator 701 comprising up/down counter 705 running at a fast rate and integrating adder 706 running at a slower rate, a single stage integrator could be implemented, using a single up-down counter, clocked at the high clock rate of CKF. The output of such a single stage integrator could be sampled at a rate appropriate for the following DAC. Such a single stage integrator would be simpler in structure than integrator 701 comprising a multi-bit adder, and thus would require smaller chip area; however in this case the whole up-down counter would need to be clocked at the higher clock rate, giving increased power consumption, especially as the output would be continually ramping up and down at the high clock rate.

Although not illustrated, it will be appreciated by those skilled in the art that the output from the integrator could be up-sampled, i.e. interpolated, or down-sampled, i.e. decimated, to a different clock rate so as the be compatible with the clock rate of the input signal Din.

Figure 8:
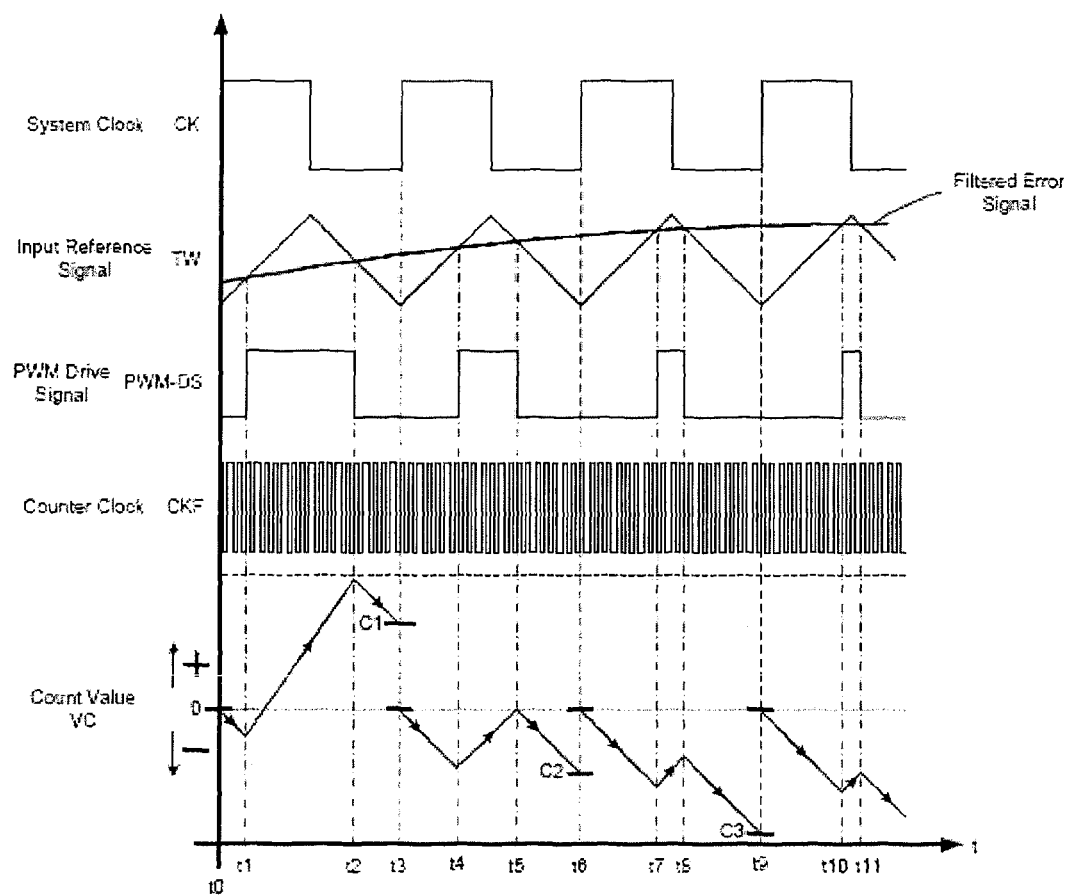
FIG. 8 illustrates the operation of the embodiment shown in FIG. 7.

FIG. 8 illustrates some the various signals associated with the amplifier of FIG. 7.

FIG. 8 illustrates the system clock CK that is used to: (i) clock the integrator 407; (ii) reset the up/down counter; and (iii) generate the illustrated input reference signal TW for the bi-level quantizer 703. It should be noted in this embodiment the frequency of the input reference signal TW is the same as, and hence synchronized with, that of the system clock CK.

Also illustrated in FIG. 8 is the filtered error signal that is illustrated as being superimposed over the input reference signal TW. Firstly it will be appreciated that the filtered error signal may be, for example, an audio band component and is thus at a much lower frequency than that of the input reference signal TW. Furthermore, the filtered error signal as illustrated is an idealized signal in the sense that it does not illustrate any high frequency components such as output ripple, noise etc. that would normally be present on such a signal: the filtered error signal has been herein idealized for reasons of clarity of explanation. As can be seen in this figure, there are clearly instances between t1-t2, t3-t4, t5-t6 and t7-t8 where the amplitude of the input reference signal TW is greater than that of the filtered error signal. Conversely, there are clearly instances between t0-t1, t2-t3, t4-t5 and t6-t7 where the amplitude of the input reference signal TW is less than that of the filtered error signal.

Also illustrated in FIG. 8 is the pulse-width-modulated (PWM) two-level drive signal PWM-DS, derived by comparison of the triangle wave and the filtered error signal. As can be seen, when the amplitude of the input reference signal TW is greater than that of the filtered error signal, i.e. during the periods t1-t2, t3-t4, t5-t6 and t7-t8, the output signal (PWN-DS) of the bi-level quantizer 703 is a signal state 1. Conversely, when the amplitude of the input reference signal TW is less than that of the filtered error signal, i.e. during the periods t0-t1, t2-t3, t4-t5 and t6-t7, the output signal (PWN-DS) of the bi-level quantizer 703 is a signal state 0. It will be seen that there is a single continuous period of state 1 within each period of the sample clock.

FIG. 8 also illustrates the up/down counter clock CKF. It should be noted that all the signals of FIG. 8 and their depicted respective relative frequencies are for illustrative purposes only and are not intended to by limiting. In reality, the frequency of the counter clock CKF, for example, will typically be significantly greater than illustrated. FIG. 8 finally illustrates the count value VC that is counted by and then output from the up/down counter 705 during each clock cycle of the integrating adder 706. An arbitrary staring point in time, t0, during normal steady state operation has been chosen for the purposes of explanation of the operation of the amplifier. On the rising edge of the system clock CK the up/down counter 705 is reset as described above. This has the effect of the up/down counter 705 outputting to the integrating adder 706 the count vale VC (i.e. C1, C2, C3 etc.) that has been reached when the system clock CK has a rising edge and then resetting the count value VC of the up/down counter to zero as illustrated at times t0, t3, t6 and t9.

During the periods t0-t1, t2-t4, t5-t7, t8-t10 and t11+, the output drive signal PWM-DS is at a low, i.e. 0, output state, since the amplitude of the input reference signal TW is less than that of the filtered error signal, and as a result, the up/down counter 705 is counting down as illustrated during the periods t0-t1, t2-t4, t5-t7, t8-t10 and t11+.

During the periods t1-t2, t4-t5, t7-t8, t10-t11, the output drive signal PWM-DS is at a high, i.e. 1, output state, since the amplitude of the input reference signal TW is greater than that of the filtered error signal, and as a result, the up/down counter 705 is counting up as illustrated during the periods t1-t2, t4-t5, t7-t8, t10-t11.

Figure 9:
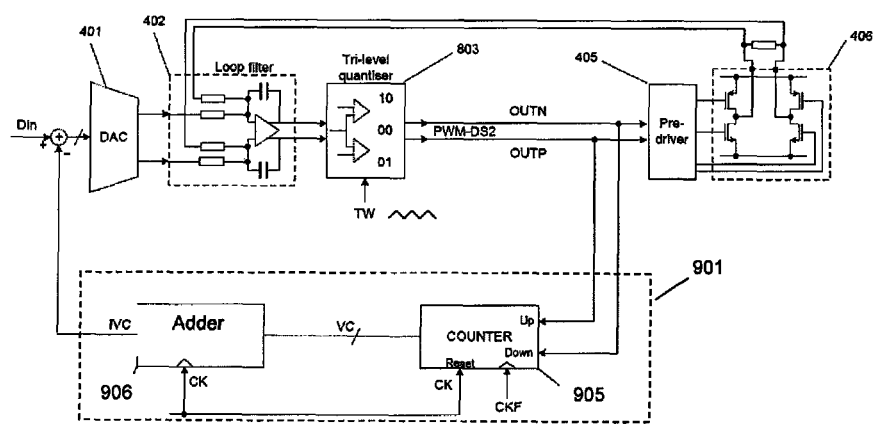
FIG. 9 illustrates another embodiment having PWM control.

FIG. 7 illustrates an embodiment of PWM control for a class-D amplifier which operates with only two output states. It will be appreciated however that three state and four state PWM control schemes also exist. FIG. 9 illustrates an embodiment similar to that illustrated in FIG. 7 but which operates with at least three output states.

The embodiment shown in FIG. 9 comprises a tri-level quantizer 803 which receives the filtered differential error signal that is output from the loop filter 402 and an input reference signal TW in the form of a time-varying cyclic reference signal for example a triangle wave. The output of the tri-level quantizer 803 is illustrated as two-wire drive signal PWM-DS2 that comprises one output drive signal OUTP and one output drive signal OUTN. The two-wire drive signal PWM-DS2 may be represented by the signal states 01, 10 and 00. Again it will be noted that this two wire drive signal may be an asynchronous digital control signal.

As described previously, for amplifiers where the output H-bridge is driven in three states, these states may be mapped one-to-one directly to the three output states A, B and C illustrated in FIG. 2. For four-state output schemes, the output from tri-level quantizer 803 may be input to converter or remodulator (not illustrated) in order to generate four output states from a 3 state input signal PWM-DS2.

The output drive signal PWM-D2 of the tri-level quantizer 803 (or converter if present) is passed to the pre-driver 405 which controls the output H-bridge stage 406.

As with previous embodiments it will be appreciated that the function of the quantizer 803 and converter (if present) could be combined. Additionally or alternatively the function of the converter (if present) and the pre-driver 405 may be combined and the converter may directly produce drive signals for the H-bridge 406.

The embodiment shown in FIG. 9 additionally comprises an integrator 901 which comprises a counter 805 coupled to an integrating adder 806. It should be appreciated that the counter 805 may be a standalone stage, as illustrated, or may be formed as part of the integrating adder 806.

The counter 805 in this PWM embodiment is clocked in the same manner, i.e. with a fast clock signal CKF with the system clock being applied to a reset input, and for the same reasons, as was described in respect of FIG. 7 and shall not be described further. The counter 805 receives the drive signals OUTP and OUTN from the tri-level quantizer 803 on respective Up and Down input terminals. For the three signal states 10, 01, 00 on the respective drive signals OUTP, OUTN, the counter 805 counts up by one when the signal state is, 10, counts down by one when the signal state is, 01, and does not count when the signal state is, 00.

Counter 805 therefore outputs a multi-bit count value VC, at a frequency determined by the clock signal CK, which indicates the difference between time spent in the positive output state and the negative output state within a system clock period. This value may be input to integrating adder 806 and used to derive an offset correction signal as described above in relation to FIG. 7.

It can therefore be seen that embodiments of the present invention may be implemented as PDM amplifiers or equally as PWM amplifiers. In general in Class-D amplifiers the output stage is switched between discrete output states and the methods described above determine the relative amount of time spent in a positive output state compared to a negative output state by counting the number of instances of a positive output state and the number of instances of a negative output state and determining the difference. In a PDM embodiment the count can be conducted at the system clock rate, in a PWM embodiment the count is conducted at a fast clock rate.

It will be noted that in the case of embodiments above of a PDM amplifier, the quantizer quantizes the difference between the filtered error signal and one or more reference voltages at a particular clock rate and outputs a quantized output signal at the particular clock rate. In the case of embodiments above of a PWM amplifier, the quantizer quantizes the difference between the filtered error signal and the modulated, i.e. time-varying cyclic, reference signal at the time-varying cyclic rate of the reference signal.

The embodiments described above have mainly been described in terms of a full H-bridge output stage but, as mentioned in relation to FIG. 3, embodiments of the invention may be readily adapted and implemented with a half-bridge or single ended output stage.

The embodiments have also been described in relation to closed loop arrangements with feedback from the output to the input for the purposes of amplifier control at the frequencies of the input signals. The general principles of the invention are also applicable to open-loop arrangements, i.e. without a feedback path for signal control (but obviously with a feedback path including an integrator 407 for D.C. offset control). The amplifier circuit may advantageously be used to amplify audio input signals for instance as part of an audio driving circuit or audio signal processing circuit. However embodiments of the invention may be implemented to amplify a range of different input signals for a variety of applications.

The amplifier circuit may conveniently be implemented as an integrated circuit and may form part of a host electronic device, especially a portable device and/or a battery powered device. The amplifier may be used in an audio device such as a personal music or video player. The amplifier may be implemented in a mobile communications device such as mobile telephone or a computing device, such as a laptop or tablet computer or PDA. The amplifier may be used in a gaming device. The amplifier may be used in device having an ultrasonic transducer or a haptic transducer.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfill the functions of several units recited in the claims. The word "amplify" can also mean "attenuate", i.e. decrease, as well as increase and vice versa and the word "add" can also mean "subtract", i.e. decrease, as well as increase and vice versa. Any reference numerals or labels in the claims shall not be construed so as to limit their scope.

What is claimed is:

1. A Class-D amplifier circuit for amplifying an input signal comprising:
   an output stage comprising a plurality of switches operable to provide a plurality of output states comprising at least a positive output state and a negative output state;
   control circuitry configured to receive a first signal based on the input signal and produce a digital control signal, wherein the digital control signal is used to determine the switch state of the output stage;
   a digital integrator configured to receive a feedback signal indicative of the output state of the output stage, to sample said feedback signal at a sample rate, and to produce an integrated output signal indicating the difference in number of instances of the positive output state and the negative output state;

correction circuitry for subtracting the integrated output signal from the input signal to produce a signal from which the first signal is derived so as to provide correction for any D.C. offset; and wherein said feedback signal is derived from the signal path of the amplifier upstream of the output stage.

2. A Class-D amplifier circuit as claimed in claim 1 wherein said feedback signal is derived from the digital control signal produced by the control circuitry.

3. A Class-D amplifier circuit as claimed in claim 2 wherein said feedback signal comprises said digital control signal produced by the control circuitry.

4. A Class-D amplifier circuit as claimed in claim 2 wherein said feedback signal comprises a modulated version of the digital control signal produced by the control circuitry.

5. A Class-D amplifier circuit as claimed in claim 1 wherein said feedback signal is derived from said control circuitry.

6. A class D-amplifier as claimed in claim 1 comprising at least one pre-driver configured to generate switch control signals for said plurality of switches where said feedback signal is derived from said switch control signals.

7. A Class-D amplifier circuit as claimed in claim 1 wherein the digital integrator is operable in a first mode wherein the gain of the digital integrator has a first value such that the bandwidth of the feedback loop comprising the integrator is lower than the frequency band of the signals of interest.

8. A Class-D amplifier circuit as claimed in claim 7 wherein the digital integrator has a variable gain.

9. A Class-D amplifier circuit as claimed in claim 8 wherein the digital integrator is operable in a second mode wherein the gain of the integrator has a second value, which is higher than the first value.

10. A Class-D amplifier circuit as claimed in claim 9 wherein, in response to a trigger, the digital integrator is configured to operate in said second mode for a predetermined period of time.

11. A Class-D amplifier circuit as claimed in claim 9 wherein, in response to a trigger, the digital integrator is configured to operate in said second mode until the integrated output signal is stable.

12. A Class-D amplifier circuit as claimed in claim 9 wherein said trigger comprises at least one of: power-on of the amplifier, a start command or a reset command.

13. A Class-D amplifier circuit as claimed in claim 9 wherein the output stage is configured to be disabled during the second mode of operation.

14. A Class-D amplifier circuit as claimed in claim 1 wherein the amplifier is configured such that if the amplifier operation is halted then the current value of the integrated output signal is maintained and used as an initial value of integrated output value when the amplifier is re-enabled.

15. A Class-D amplifier circuit as claimed in claim 1 wherein the integrated output signal is digitally subtracted from a digital input signal.

16. A class-D amplifier circuit as claimed in claim 1 wherein said correction circuitry comprises a digital to analogue converter for converting the integrated output signal into an analogue offset correction signal and subtracting the analogue offset correction signal from an analogue version of input signal.

17. A Class-D amplifier circuit as claimed in claim 16 wherein said correction circuitry comprises a loop filter circuit configured to receive the analogue input signal and analogue offset correction signal.

18. A Class-D amplifier circuit as claimed in claim 1 wherein amplifier is a pulse-density-modulated amplifier.

19. A Class-D amplifier circuit as claimed in claim 18 wherein said control circuitry is configured so as to produce said digital control signal at a first clock rate and wherein the sample rate of the feedback signal is substantially equal to said first clock rate.

20. A Class-D amplifier circuit as claimed in claim 1 wherein the amplifier is a pulse-width-modulated amplifier.

21. A Class-D amplifier circuit as claimed in claim 20 wherein said control circuitry is configured so as to receive a cyclic reference signal at a first clock rate and to within each cycle of said first clock rate adjust the amount of time at which the digital control signal spends at each possible output value.

22. A Class-D amplifier circuit as claimed in claim 21 wherein said control circuitry is configured such that, within each cycle of said first clock rate, the digital control signal is at one value for one continuous period and at another value for the remainder of the cycle.

23. A Class-D amplifier circuit as claimed in claim 21 wherein said control circuitry is configured so as to compare said first signal to said cyclic reference signal.

24. A Class-D amplifier circuit as claimed in claim 21 and wherein the sample rate at which the digital integrator samples the feedback signal is greater than said first clock rate.

25. A Class-D amplifier circuit as claimed in claim 24 wherein the sample rate is at least 64 times greater than said first clock rate.

26. A Class-D amplifier circuit as claimed in claim 24 comprising dither circuitry for applying temporal dither to the sample rate at which the digital integrator samples the feedback signal.

27. A Class-D amplifier circuit as claimed in claim 21 wherein said digital integrator comprises counter circuitry for receiving said feedback signal and a clock signal at a second clock rate and producing a count value indicating the difference in number of instances of the positive output state and the negative output state during each period of the second clock.

28. A Class-D amplifier circuit as claimed in claim 27 wherein said second clock rate is equal to said first clock rate.

29. A Class-D amplifier circuit as claimed in claim 27 wherein the counter circuitry count value is reset at the second clock rate.

30. A Class-D amplifier circuit as claimed in claim 27 wherein the counter circuitry count value is input at the second clock rate to a digital integrating adder stage which outputs said integrated output signal at a third clock rate.

31. A Class-D amplifier circuit as claimed in claim 30 wherein said second clock rate is equal to said third clock rate.

32. A Class-D amplifier circuit as claimed in claim 1 wherein the output stage comprises a full H-bridge stage.

33. A Class-D amplifier circuit as claimed in claim 1 wherein the output stage comprises a single-ended half bridge stage.

34. A Class-D amplifier circuit as claimed in claim 1 wherein the control circuitry comprises a quantizer.

35. An integrated circuit comprising a class-D amplifier circuit as claimed in claim 1.

36. A driver circuit comprising a class-D amplifier circuit as claimed in claim 1.

37. A driver circuit as claimed in claim 36 wherein said driver circuit is arranged to drive at least one of: an audio transducer, a haptic transducer, an ultrasound transducer; or an electromechanical actuator or motor.

38. An electronic device comprising a circuit as claimed in claim 1.

39. An electronic device as claimed in claim 38 wherein the device is at least one of: a portable device; a battery powered device; a mobile communications device; a computing device; a gaming device; an audio device; or an ultrasonic device.

40. A method of correcting for D.C. offset in a Class-D amplifier having an output stage operable to provide a plurality of output states comprising at least a positive output state and a negative output state, the method comprising:
- receiving a first signal based on an input signal to be amplified and producing a digital control signal used to determine the output state of the output stage;
- receiving a feedback signal indicative of the output state of the output stage; sampling said feedback signal at a sample rate;
- producing an integrated output signal indicating the difference in number of instances of the positive output state and the negative output state;
- subtracting the integrated output signal from the input signal to produce a signal from which the first signal is derived so as to provide correction for any D.C. offset; and
- wherein said feedback signal is derived from the signal path of the amplifier upstream of the output stage.

41. A Class-D amplifier circuit for amplifying an input signal comprising:
- an output stage comprising a plurality of switches operable to provide a plurality of output states comprising at least a positive output state and a negative output state;
- first circuitry for sampling a signal indicative of the output state of the output stage to produce an offset value indicative of the difference in the number of instances of the positive output state compared to the negative output state over time; and
- correction circuitry configured to apply offset correction to said input signal based on said offset value.

42. A Class-D amplifier circuit for amplifying an input signal comprising:
- an output stage comprising a plurality of switches operable to provide a plurality of output states comprising at least a positive output state and a negative output state;
- first circuitry for determining, over time, an offset value indicative of any difference in the amount of time the output stage spends in the positive output stage compared to the negative output stage; and
- correction circuitry configured to apply offset correction to said input signal based on said offset value.

43. A Class-D amplifier circuit for amplifying an input signal comprising:
- an output stage operable in at least a positive output state and a negative output state;
- feedback path for D.C. offset correction, wherein said feedback path comprises a digital integrator configured to receive a digital signal indicative of the output state of the amplifier and to produce a value indicative of the difference in the number of samples indicating the positive output state and the number of samples indicating the negative output state.

* * * * *